(12) United States Patent
Robbins et al.

(10) Patent No.: US 8,049,171 B2
(45) Date of Patent: Nov. 1, 2011

(54) VARIABLE APERTURE SENSOR

(75) Inventors: Mark Robbins, Essex (GB); Kevin Anthony Derek Hadfield, Essex (GB)

(73) Assignee: E2V Technologies (UK) Limited, Chelmsford (GB)

( * ) Notice: Subject to any disclaimer, the term of this patent is extended or adjusted under 35 U.S.C. 154(b) by 207 days.

(21) Appl. No.: 12/000,204

(22) Filed: Dec. 10, 2007

(65) Prior Publication Data

US 2009/0008553 A1 Jan. 8, 2009

(30) Foreign Application Priority Data

Dec. 8, 2006 (GB) .................................. 0624576.5

(51) Int. Cl.
*G01J 1/42* (2006.01)
(52) U.S. Cl. ............................. 250/336.1; 250/370.1
(58) Field of Classification Search .............. 250/370.1, 250/370.11, 336.1
See application file for complete search history.

(56) References Cited

U.S. PATENT DOCUMENTS

| | | | |
|---|---|---|---|
| 4,688,067 A | 8/1987 | Rehak et al. | |
| 4,837,607 A | 6/1989 | Kemmer et al. | |
| 6,249,033 B1 | 6/2001 | Castoldi et al. | |
| 6,794,654 B1 | 9/2004 | Hansen et al. | |
| 6,995,444 B2 | 2/2006 | Cova et al. | |
| 2004/0149919 A1 | 8/2004 | Lechner et al. | |
| 2004/0195493 A1* | 10/2004 | Hashimoto et al. | 250/214 R |
| 2005/0173733 A1* | 8/2005 | Struder et al. | 257/202 |

FOREIGN PATENT DOCUMENTS

| | | |
|---|---|---|
| EP | 0383389 A1 | 8/1990 |
| GB | 2413007 | 10/2005 |
| WO | WO-01/78153 A2 | 10/2001 |
| WO | WO/2004/090994 A1 | 10/2004 |
| WO | WO2006/012764 | 2/2006 |
| WO | WO2006/053938 | 5/2006 |

OTHER PUBLICATIONS

UK Search Report dated Apr. 24, 2007, issued in connection with Application No. GB0624576.5.

(Continued)

*Primary Examiner* — David Porta
*Assistant Examiner* — Hugh H Maupin
(74) *Attorney, Agent, or Firm* — Venable LLP; Robert Kinberg; Christopher Ma (57) ABSTRACT

A sensor device of the type for sensing incident radiation by charge generation, has a substrate within which charge may be generated by incident radiation. A plurality of electrodes are arranged to cover an image area of the substrate and are selectively connectable to supplied DC voltages such that an electric field is created across the image area to sweep charge across multiple electrodes from the image area to an output. The voltage applied to one of the electrodes may be a voltage of a level so as to present a barrier to charge within the image area. The sensor thus has a variable sample area defined by the barrier voltage level.

25 Claims, 9 Drawing Sheets

OTHER PUBLICATIONS

Emilio Gatti, et al., "Semiconductor Drift Chamber—An Application of a Novel Charge Transport Scheme," *Nuclear Instruments and Methods in Physics Research 225* (1984), pp. 608-614.

E. Gatti et al., "Semiconductor Drift Chamber—An Application of a Novel Charge Transport Scheme," Nucl. Instr. and Meth. A 225, 1984, pp. 608-614.

European Search Report issued in EP 07 25 4769.8 dated Jan. 5, 2011.

Struder, L.: "High-resolution Imaging X-ray Spectrometers," Nuclear Instruments and Methods in Physics Research A 454 (2000), pp. 73-113.

Kemmer, J. et al.: "New Detector Concepts," Nuclear Instruments & Methods in Physics Research/Section A, A253, Jan. 15, 1987, No. 3, Amsterdam, The Netherlands, pp. 365-377.

Lutz, G et al., "The Avalanche Drift Diode: A New Detector Concept for Single Photon Detection," 2004 IEEE Nuclear Science Symposium Conference Record Oct. 16-22, 2004 Rome, Italy, 2004 IEEE Nuclear Science Symposium Conference Record (IEEE Cat. No. 04CH37604) IEEE Piscataway, NJ USA, vol. 1, Oct. 16, 2004, pp. 21-24.

Extended European Search Report EP 07 25 4769.8 dated May 4, 2011.

\* cited by examiner

VARIABLE APERTURE SENSOR

CROSS-REFERENCE TO RELATED APPLICATIONS

Priority is claimed with respect to British Application No. GB 0624576.5 filed on Dec. 8, 2006, the entire disclosure of which is incorporated herein by reference. Each U.S. and foreign patent and patent application mentioned below is additionally incorporated herein by reference.

FIELD OF THE INVENTION

The present invention relates to sensors, in particular to sensor devices for use in applications requiring rapid sensing such as in microscopy applications.

BACKGROUND OF THE INVENTION

Sensors for radiation of different types are known for different applications, such as light sensors, x-ray sensors and others. Depending upon the wavelength and rate of change of radiation to be sensed, different types of sensors are appropriate. One particular field of light sensing is confocal microscopy.

The concept behind confocal microscopy as used in fluorescence microscopy is as follows. Fluorescent dye molecules can be attached to specific parts of the biological sample of interest. When excited by a suitable wavelength of light these markers fluoresce so that only those parts are seen in the microscope. The fluorescence is usually stimulated by a laser or lasers and is detected by a suitable sensor, usually a photomultiplier tube. The sample is scanned by the illumination/detector to build up an image of the fluorescence across the sample. It is necessary to place a very small aperture (pin hole) within the optical path to prevent light from unwanted regions of the sample from being detected. One arrangement of a typical confocal microscopy system is illustrated in FIG. 1.

Figure 1:
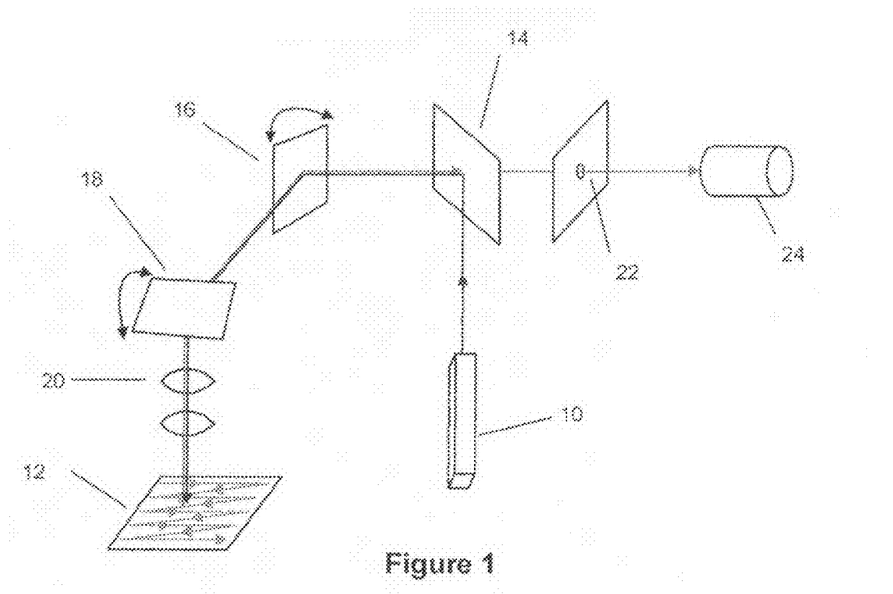
FIG. 1: is a block diagram of a known laser scanning microscopy device.

The laser scanning microscopy device of FIG. 1 comprises a laser 10 arranged to illuminate a sample 12 via a dichroic mirror and two scanning mirrors 16, 18. The scanning mirrors cause the laser beam to scan the surface of the sample 12. Imaging optics 20 are arranged so that the scanning spot of light in the sample is imaged onto a pin hole 22. This arrangement is referred to as a confocal arrangement and ensures that only fluorescence from a particular spot being scanned reaches a detector 24. Any light from a depth within the sample that is not at the focus of the optics will not be focussed exactly on the pin hole (it will form a pattern larger than the pin hole) and so will not pass to the detector 24. The confocal arrangement thus allows different portions of a sample to be sampled over time (as the beam scans) and so this is a form of time resolved microscopy.

In the example of confocal microscopy, it is important that the light level can be sampled rapidly so that individual spots are sampled as the laser scans the surface of the sample. There are similar time constraints in other applications.

Figure 17:
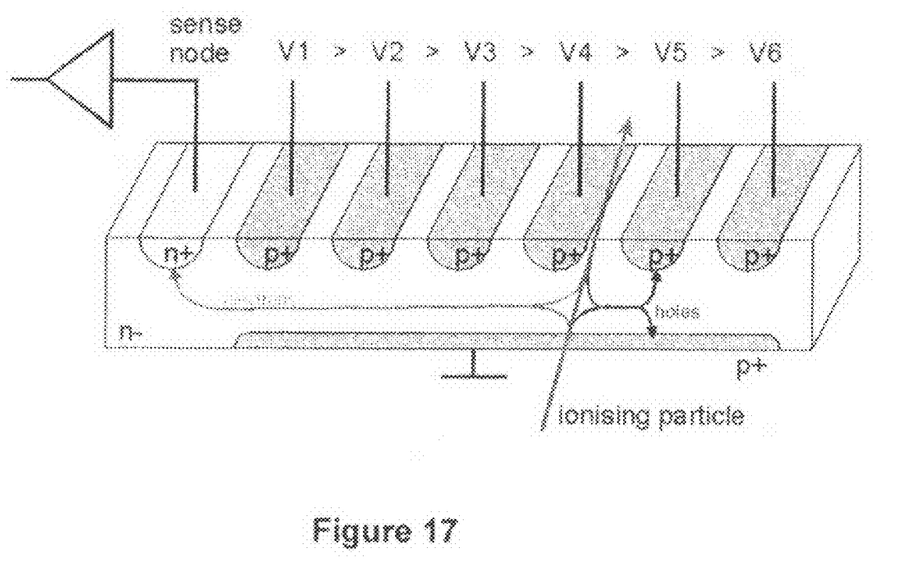
FIG. 17: shows a known drift detector.

We have appreciated that a type of sensor known as a Silicon Drift Detector has certain advantages of speed in applications such as microscopy. The concept of the silicon drift detector was proposed in 1983 by E. Gatti, P. Rehak, "Semiconductor Drift Chamber—An Application of a Novel Charge Transport Scheme", Nucl. Instr. and Meth. A 225, 1984, pp. 608-614. It consists of a volume of fully depleted high-resistivity silicon, in which an electric field with a strong component parallel to the surface drives electrons generated by the absorption of ionising radiation towards a small sized collecting anode. The electric field is generated by a number of increasingly reverse biased field strips (creating p-n diodes) covering one surface of the device. The concept is shown in FIG. 17.

Various refinements have been proposed including a concentric ring arrangement where the sense node is in the centre of the device. These devices find particular application in the field of x-ray spectroscopy. The structure is almost always based on refinements of the arrangement shown in FIG. 17 in which an appropriate electric field is applied via the diode contacts to sweep all the charge out of the device.

Variations on known Silicon Drift Detectors are known in various prior published documents.

U.S. Pat. No. 4,688,067 describes the operation of the silicon drift detector. This shows how biases applied to the p+ contacts can be used to sweep charge to a sense node.

WO 2006/012764 discloses a type of variable aperture sensor with variable size based on parallel electrodes arranged to vary an effective "slit" size.

U.S. Pat. No. 4,837,607 improves on the electrode arrangement.

EP 0383389 describes a modification to the SDD whereby the signal generated through the p+ contacts is used to time the arrival of the incident radiation and thus gain positional information.

U.S. Pat. No. 6,249,033 B1 describes a complication of the basic SDD to obtain positional information without the need for timing.

US 2004/0149919 A1 shows a modification to the SDD to improve uniformity of response etc.

U.S. Pat. No. 6,794,654 B1 describes a module of SDDs.

US 2005/0173733 A1 describes how to make contact to the sensing node in the middle of a concentric ring arrangement.

WO 2006/053938 A1 describes a very specific modification to the SDD in order to prevent surface leakage effects.

SUMMARY OF THE INVENTION

We have appreciated the benefit of using semiconductor devices as sensors for radiation, but also appreciate certain limitations of speed of sensing in clocked charge coupled devices (the limitation being the clocking speed).

We have further appreciated that the choice of the size of the pinhole in confocal systems is a compromise between the resolution and the amount of optical signal being detected and thus noise. A very small pinhole will give good resolution at the expense of high noise. This is because a very small pinhole limits the sample area to a very small size and so the amount of detected signal will be low. A larger pinhole will lead to reduced noise but a lower resolution. This is because the larger pinhole will allow detection of light from a larger sample area giving a larger signal, but the larger sample area gives a reduced resolution. We have further appreciated, therefore, the benefit of being able to adjust the size of the sample area to provide an appropriate balance between resolution and noise.

The invention is defined in the claims to which reference is now directed.

In broad terms, the invention provides a new sensor arrangement having a plurality of electrodes configurable to provide a field gradient across the plurality of electrodes such that charge within the sensor generated by incident radiation is swept by the field gradient across the electrodes to an output, and with at least one of the electrodes being connectable to a DC voltage so as to present a barrier to charge within the image area whereby the sensor has a variable sample area.

The fact that charge is swept by a field gradient across a plurality of electrodes allows rapid transfer of signal charge in comparison to known clocked schemes of CCD devices. The fact that the sample area is variable allows the sample area to be selected to balance the needs of sensitivity and resolution of the sensor. This aspect of the invention uses a technique of providing an arrangement of electrodes on the sensor arranged so that, when appropriate voltages are applied, charge is swept only from the selected sample area to an output.

An embodiment of the present invention can replace the photomultiplier/pinhole combination of the confocal arrangement discussed above with a single sensor. In addition to providing a much more robust arrangement it also gives the user the ability to adjust the size of the sensitive area quickly and accurately. A multiplication register is included on the same monolithic substrate as the plurality of electrodes so as to provide multiplication of charge received from the sample area to provide the necessary sensitivity.

The sensor may be used for a variety of wavelengths of radiation, including x-rays, though the main application is for sensing in the visible spectrum of light. Variations to sense other wavelengths are possible without significant change to the architecture of the embodiment described, though the dimensions and types of material used may differ. The substrate is preferably a p-type silicon substrate with a buried n-type channel. Other substrates are possible including n-type with a buried p-type channel and also surface channel arrangements of either n-type or p-type.

The electrodes may be arranged directly on the substrate as in architectures of n-type substrates with p-type electrodes. Preferably, though, the electrodes are arranged over the surface of the substrate, separated by an insulating layer in a conductor-insulator-semiconductor arrangement.

The electrodes themselves may be arranged in a variety of shapes and patterns to define a sample area of variable size. The preferred arrangements have each electrode in turn substantially surrounding the preceding electrode, such that the size of the sample area may be expanded and contracted by choosing which electrode defines the outer boundary of the sample area. The preferred example of this arrangement is a series of concentric electrode rings. It is equally possible for the electrodes to define other patterns of sample area.

The electrodes are connectable such that applied voltages cause an electric field across the image area to sweep charge across multiple electrodes from the image area to an output. The sensor may thus be configured to sweep charge to an output from an area defined by a single electrode to a maximum of an area defines by all electrodes as well as any area defined by a contiguous arrangement of electrodes between. The electrodes defining the sample area must be contiguous in the sense that charge passes directly from the region of one electrode to another under the influence of the potential gradient caused by the voltage difference between electrodes.

Any one of the electrodes may be connected to a DC voltage of a level so as to present a barrier to charge within the image area. The barrier is a potential gradient that prevents charge from outside the sample area reaching the output so that only charge within the chosen sample area is sampled. The DC voltages applied to the electrodes may all be adjusted so that one of the electrodes creates a field that provides a barrier, and the voltages applied to the other electrodes have appropriate voltages to sweep charge from the sample area to the output. For the avoidance of doubt, the DC voltages are thus variable, not fixed.

The size and number of electrodes may be chosen appropriate to the intended use of the sensor. There is a limit to the maximum electrode width, though, as the potential gradient under electrodes will reduces with increasing width of the electrodes. The preferred size is electrodes of width 5 microns so that fringing fields provide an appropriate voltage gradient. The voltages applied may be selectable for individual electrodes or groups of electrodes.

BRIEF DESCRIPTION OF THE FIGURES

An embodiment of the invention in the various aspects noted above will now be described with reference to the figures in which.

DESCRIPTION OF EMBODIMENTS OF THE INVENTION

The embodiments of the invention comprise devices with electrodes so arranged that, by application of appropriate bias voltages, charge can be accumulated and sensed from an area of variable size. The electrodes could be arranged in a variety of patterns, but the preferred embodiment has a succession of electrodes with each in succession substantially surrounding the first. The embodiment described has an arrangement of annular concentric electrodes. Preferably, the rings are uniformly spaced, but other arrangements and shapes are possible. Various different embodiments having further arrangements and shapes are described later. In essence, the embodiments provide a variable size or "aperture" sensor. The sensor is capable of high-speed signal acquisition and is highly sensitive when a charge multiplication register is used within its architecture. The control of the voltages applied to the electrodes is by a control biasing circuit.

Figure 2:
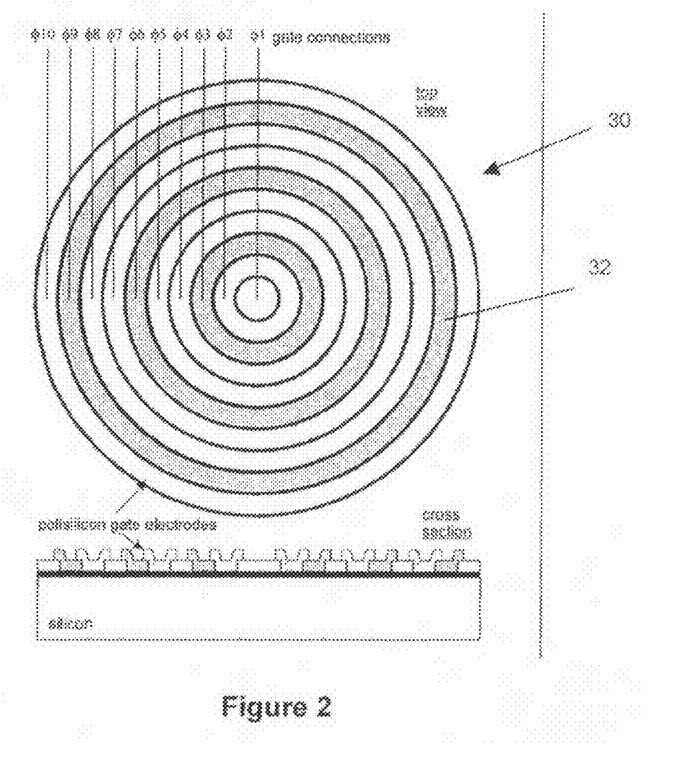
FIG. 2: is a schematic view of a sensor embodying the invention.

A preferred embodiment of the invention is shown in FIG. 2. The embodiment of the invention is based upon an architecture similar to a CCD and comprises a sensor with an optically sensitive area 30 of circular shape covered in concentric electrodes 32. The architecture is similar to a CCD architecture in that the electrode arrangement is of the type having a conductive electrode over an insulator on the surface of a semiconductor (often referred to as MIS, which is short for metal-insulator-semiconductor). The number of rings from the centre that contribute to the active area of the device is user selectable by choosing the appropriate potential to be applied to the gates. The sample area is thus selectable. The electrodes may be referred to as gate electrodes, but it should be noted, for the avoidance of doubt, that the gate electrodes are not clocked when reading charge from the device unlike gate electrodes in conventional area array CCD devices that are clocked line by line. Thus, whilst there are similarities in structure, the operation of the embodiment of the invention is very different from known CCD devices.

The arrangement of gate electrodes in the embodiment is applied to a gate insulator layer on a p-type silicon substrate as part of a buried n-channel CCD device. The potential experienced by an electron generated within the structure is dependent on the potential applied to the gates. The structure is initially depleted of signal charge. As light to be sensed falls on the sensitive area 30, the wanted signal charge released drifts towards the centre of the device due to the potential difference across the gates. An electron generated by an incident photon will drift rapidly towards the centre of the structure, wherever it is originally generated, provided that the potentials applied to the gates are such that $\phi n > \phi n+1$ where $\phi n$ is the potential applied to the nth gate from the centre.

It is noted that the description above applies to n-channel devices in which charge is collected at the centre of the structure. Alternative arrangements include structures in which the signal is transferred to the periphery of the device. Another alternative is p-channel CCD devices in which the potentials applied to the gates would such that be $\phi n < \phi n+1$ for generated holes to drift towards the centre of the device.

Figure 3:
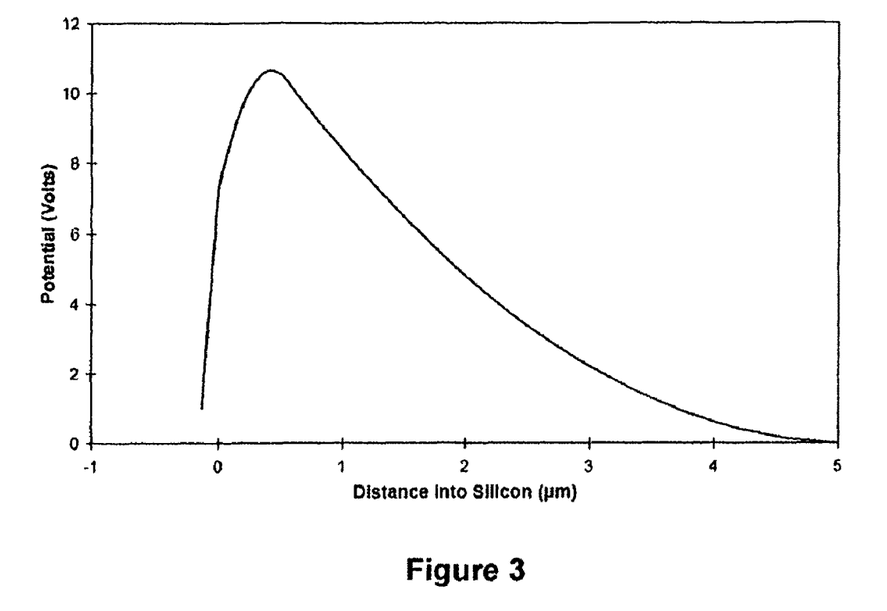
FIG. 3: is a graph showing the potential profile of a buried channel sensor.

A one dimensional potential profile for a buried channel device is shown in FIG. 3. As can be seen, in the absence of influence from surrounding electrodes, electrons would tend to collect at the point of maximum potential. This maximum potential is known as the channel potential. If two gates are placed next to each other signal electrons will tend to drift under the gate with the highest channel potential.

Figure 4:
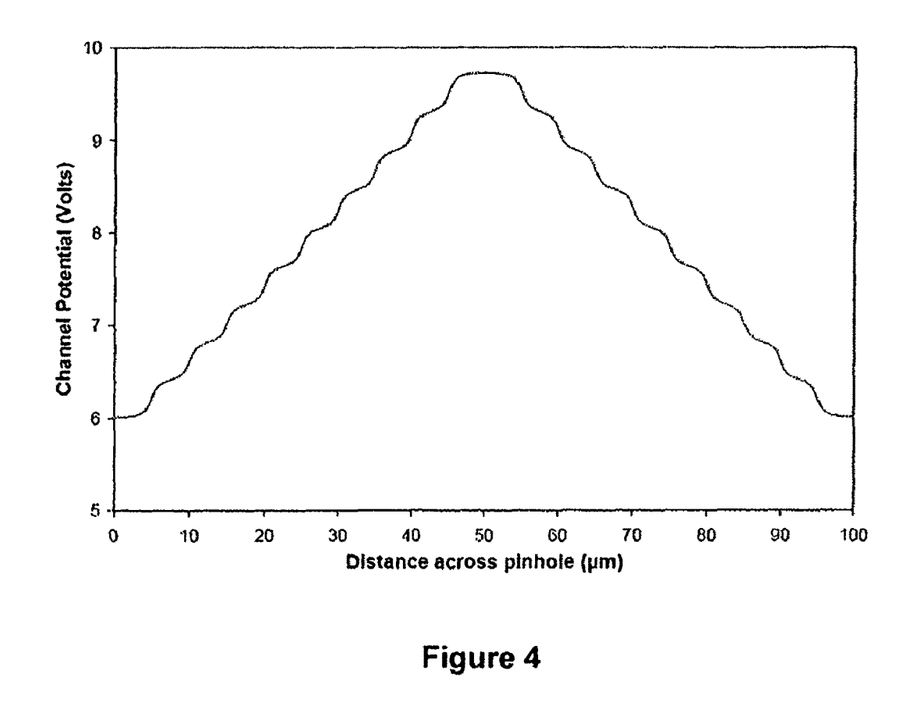
FIG. 4: is a graph showing the channel potential of the sensor of FIG. 2.

FIG. 4 shows the channel potential along the diameter of the structure shown in FIG. 2 when depleted of signal charge and with DC voltages applied to the electrodes to sweep charge from the whole of the sensitive area. In this case the p-type silicon substrate has a resistivity of 20 Ohm/cm. The n-type buried channel implant has a uniform dopant density of $2.5 \times 10^{16}$ cm$^{-3}$ extending over a depth of 0.54 microns. The gate oxide is 130 nm thick. Each ring electrode is 5 microns wide. The diameter of the central electrode is 10 microns. DC voltages are applied to the electrodes to provide a potential difference from one electrode to the next. The voltages are not clocked and provide electric fields such that an electron generated in the periphery of the device will be swept to the centre within approximately 20 ns. Faster transfer can occur if the difference between consecutive gate potentials is increased. It is noted that the potential profile is not sharply stepped from one electrode to another. This is because fringing fields cause a potential gradient under each electrode.

Figure 5:
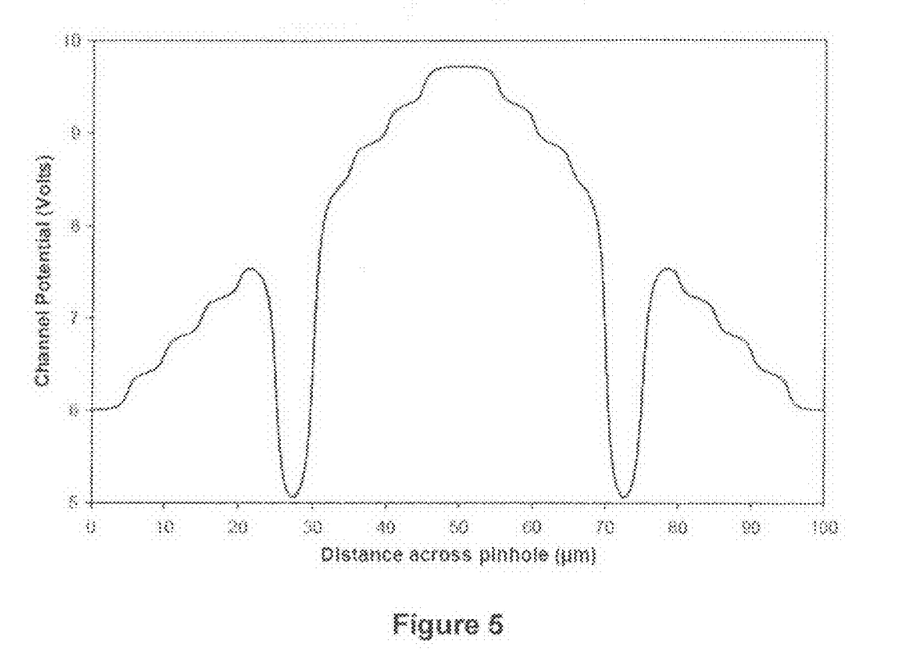
FIG. 5: is a graph showing the channel potential of the sensor of FIG. 2 with a bias applied to ring number 5.

The channel potentials shown in FIG. 4 allow signal generated over the whole device area to be collected at the centre of the device. If one of the gates is taken to a low potential, only that signal generated closer to the centre will be collected. The user can select which gate is taken low and thus the effective size of the active area. The channel potential in the case where ring number 5 is taken to a low level is shown in FIG. 5. Any charge generated closer to the periphery of the device will be prevented from reaching the centre by the potential barrier created under the low biased ring. This unwanted signal will build up and eventually spill over into a drain structure outside of the active area and thus will be eliminated.

Figure 6:
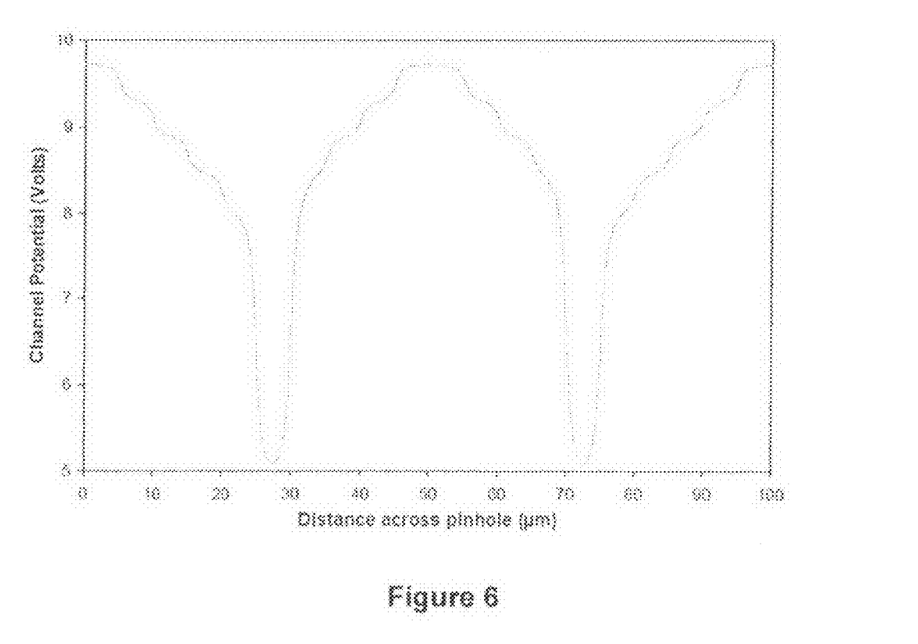
FIG. 6: is a graph showing the channel potential of the sensor of FIG. 2 with a bias to sweep charge to the edge of the device.

If high-speed removal of this unwanted signal is required the biases applied to the peripheral gates can be increased so that the electric field directs the signal into the drains. An example channel potential profile in such a case is given in FIG. 6. As can be seen, charge generated inside the ring biased to a low voltage (within around 28 microns from the edge) will be swept to the centre of the sensor, charge generated outside the ring that is biased low will be swept by the increasing voltage to the edge of the sensor.

Once the charge has reached the centre of the active area it needs to be removed and measured. The simplest approach would be to have a conventional output node connected directly to an amplifier. However, we have appreciated that the sensor could be beneficial in low light level applications, and for that reason it is preferred to provide charge multiplication prior to an output node. We have appreciated that this requires the charge to be removed from the device for amplification. The embodiments of the invention could use a CCD register extending into the centre of the device and arranged to clock the charge out of the sensor. Alternatively, other arrangements could be used that create an electric field suitable to force signal charge from the centre of the device, through a channel to the periphery without the need to clock the gates. This arrangement consists of multiple gates biased with appropriate DC levels or a single gate with modifications to the structure that creates a suitable electric field within the device. Such modifications could include the variation of gate insulator thickness along the channel, the variation of buried channel implant density along the channel or the variation of the gate electrode/channel width along the channel.

Figure 7:
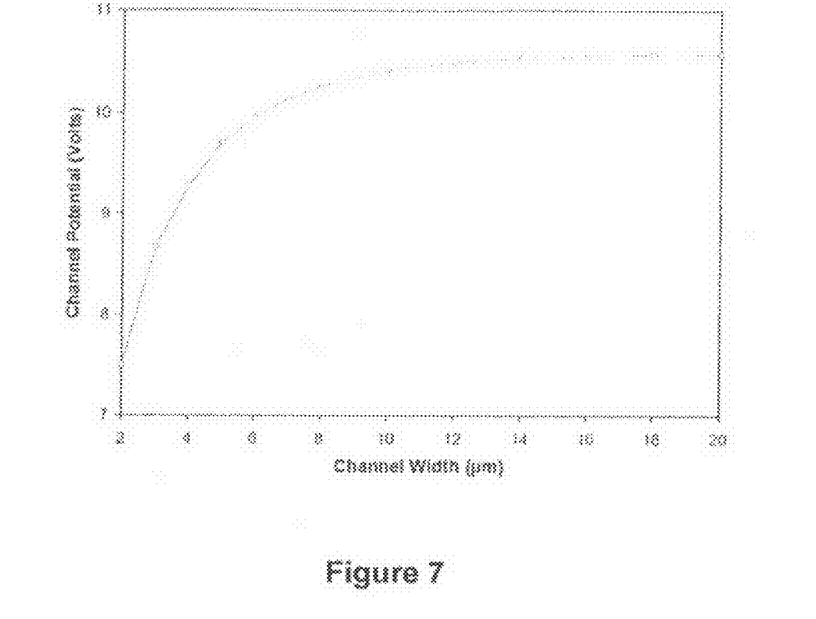
FIG. 7: is a graph showing the channel potential versus channel width.

The variation of the channel width is the preferred embodiment and is described below. The use of a single gate structure eliminates the need for multiple gate electrodes and thus simplifies the design. It also enables the faster extraction of signal than a clocked register if the potential variation along the channel is sufficiently high. The channel potential within a buried channel device is dependent on the gate potential. However, the channel potential under a gate is also dependent on adjacent structures due to fringing fields. The influence of the surrounding structures is dependent on the width of the gate. The channel potential versus gate width for a buried channel device described above is shown in FIG. 7. Here the gate is surrounded by an isolation structure, which in this case is a surface channel region but could be a p+ channel stop, or other gate electrodes biased at a low potential for example. This indicates that if a constant potential is applied to a gate that is shaped such that it is narrower at one end than the other, then the voltage will increase from the narrow end to the wide end and any electrons that are introduced at the narrow end will rapidly transfer to the wider end under the influence of the electric field. Thus a simple gate structure can be introduced to the structure in FIG. 2 to extract the signal charge.

Figure 8:
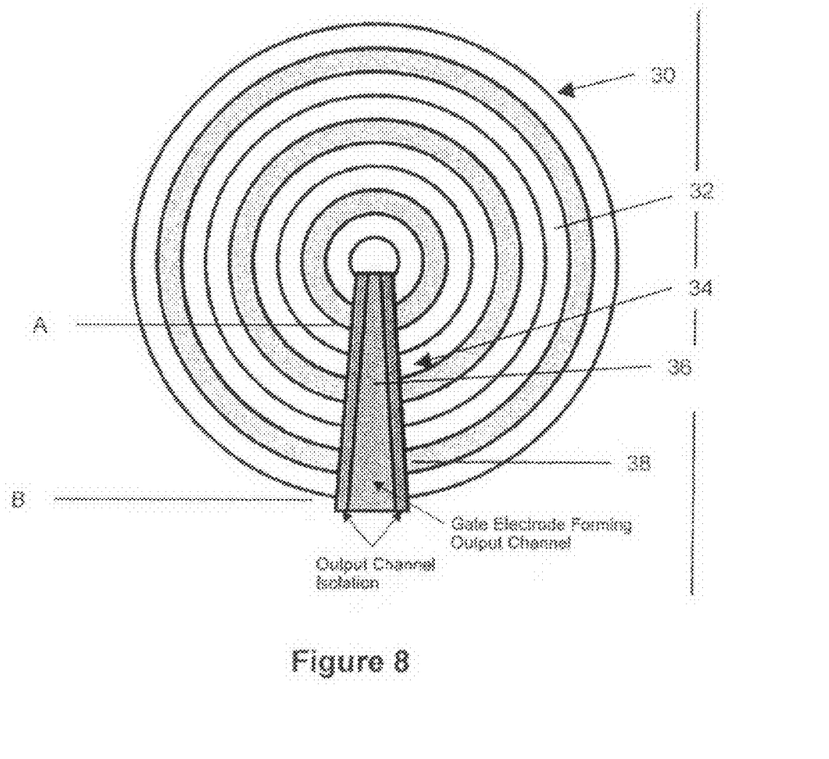
FIG. 8: is a schematic view of the sensor of FIG. 2 showing a tapered gate structure.

The preferred output gate structure is illustrated in FIG. 8. The structure 34 comprises a gate electrode 36 forming an output channel with channel isolation 38 to either side of the channel. A narrower end A is at the centre of the structure and wider end B is at the edge of the structure. If 1 Volt is applied to this gate and the gate width varies from 4 microns at the centre A of the device to 8 microns at the periphery B then the channel potential will vary from 9.2 Volts to 10.2 Volts. This potential variation is sufficient to extract a signal electron in about 20 ns if the gate length is 50 microns. Note that the gate itself need not vary in width along its length. Instead the width of the gate could remain constant and the width of the channel under the gate could be varied; it is the variation in channel width that causes the variation in potential.

Figure 9:
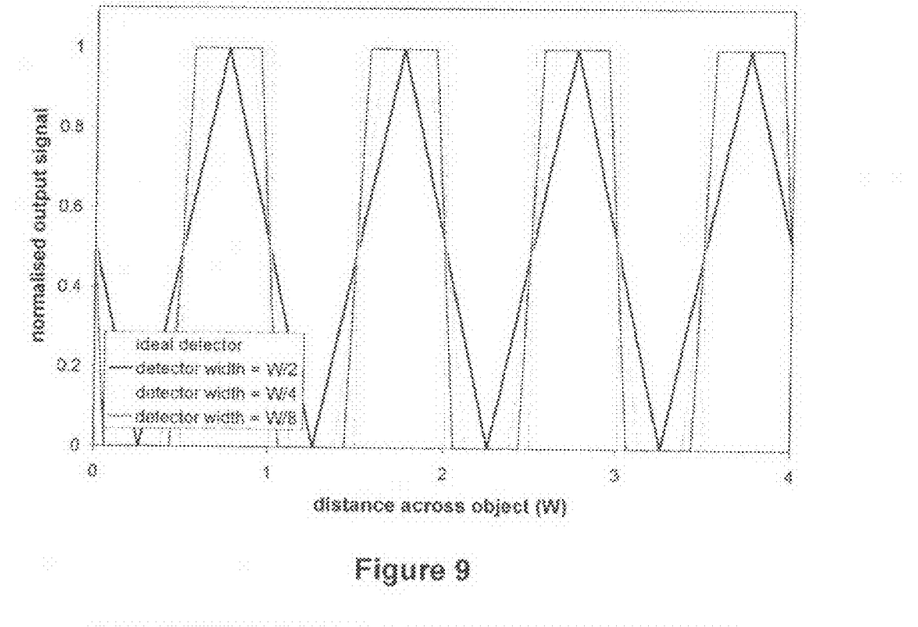
FIG. 9: shows how an output signal varies with detector size.

We have appreciated that the resolution of the sensor can degrade due to non-ideal detector behaviour. First consider an idealised detector as it scans across a sample detecting the light emitted. This fictitious detector will sample the light from the object over an infinitesimally small area and the signal will be measured as soon as the light hits the detector. If the object area is scanned by such a detector the measured signal will match the light emitted and the constructed image will show ideal resolution. However, two main things degrade the resolution. The first is that the detector cannot be infinitesimally small and light is collected over the area of the detector as it is scanned. To illustrate the result consider the case of a one-dimensional object and a one-dimensional detector. The object is made up of a bar pattern of period W. The signal from a detector of width W/2, W/4 and W/8 as it is scanned across the object is shown in FIG. 9.

Figure 10:
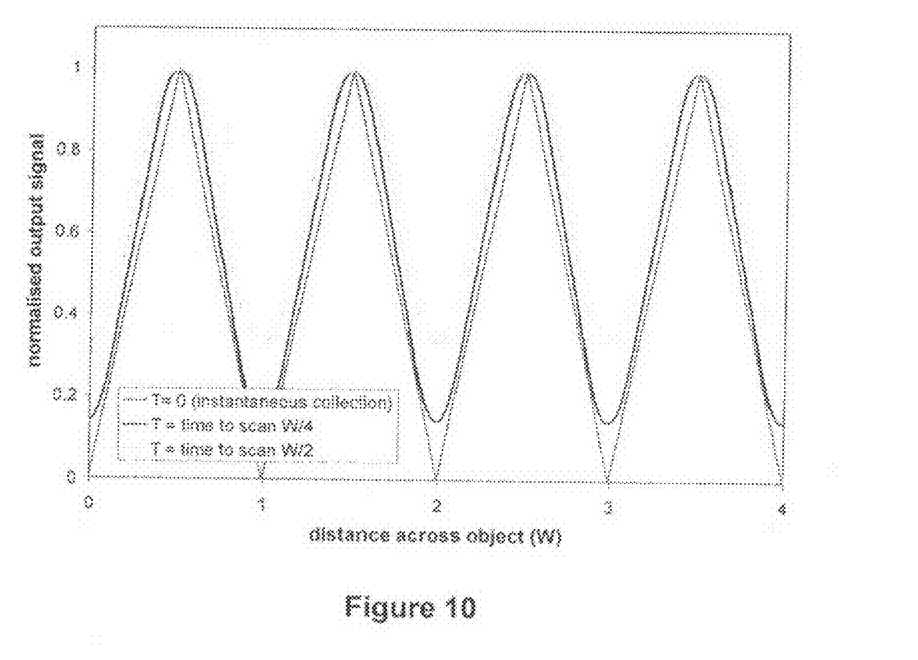
FIG. 10: shows how an output signal varies with sample time.

The second thing that degrades resolution is the finite time it takes to extract the entire signal from the detector. Consider the case of a hypothetical detector where it takes a time, T, to extract the entire signal after an initial instantaneous stimulus and the rate of signal extraction during this time is constant after the initial stimulus. The results from this detector after scanning a bar pattern of period W is shown in FIG. 10. The detector has a width of W/2. Plotted are the results for various values of T compared with the ideal case of instantaneous signal collection. T is chosen to be the time it takes to scan a distance W/2 and W/4.

It is apparent from FIG. 10 that T should be significantly less than the time to scan a distance of W/4 else the contrast at maximum resolution will be degraded. A useful value for the maximum value of T is the time to scan a distance of W/10. In practice a typical time to scan a distance of W is in the order of 1 µs giving a maximum value of T as 100 ns. The new output channel arrangement shown in FIG. 8 can achieve such rapid transfer times, but using CCD clocks to sweep signal out of the imaging area at this rate is not a feasible proposition.

Once the signal charge has been extracted from the active area it has to be converted to a potential that can be measured. A typical CCD output circuit could be attached to the output of the output channel. However, it may be desirable to include a CCD gate at the output of the output channel, which would prevent signal from entering the output circuit until this gate is pulsed to a high level or the output channel gate is pulsed to a low level.

Figure 15:
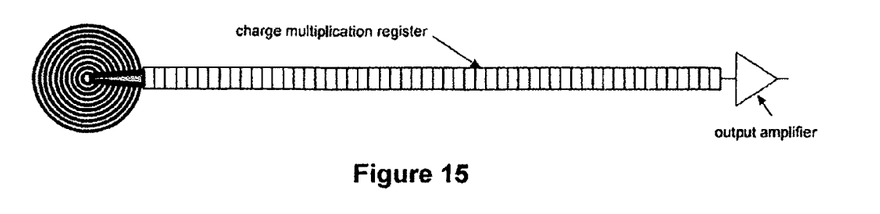
FIG. 15: is a schematic view of the output arrangement for the sensor of FIG. 2.
Figure 16:
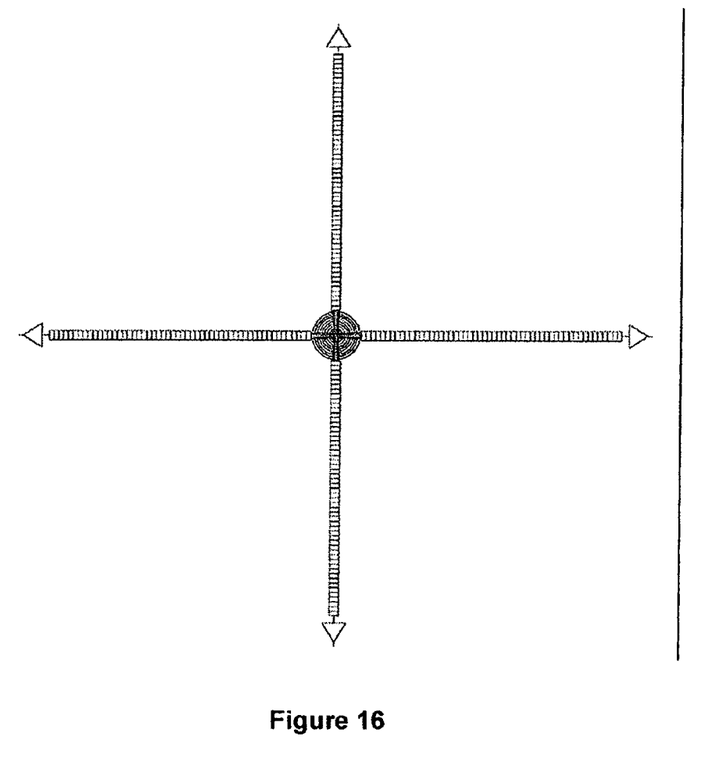
FIG. 16: shows an alternative embodiment of the invention with four output stages.

As previously noted, it is preferred that charge is multiplied in a multiplication register prior to sensing and conversion by an output amplifier. This is shown in FIGS. 15 and 16, described later, and may optionally include a transfer gate to transfer charge from the output channel to the multiplication register. The transfer gate is a CCD gate at the input of the multiplication register, which is pulsed when signal charge is required to enter the multiplication register. It is not strictly necessary but does give the user additional flexibility. For example, one may require signal to be passed to the multiplication register every 1 µs. The multiplication register could be clocked at 1 MHz and the signal will enter every 1 µs without the use of the transfer gate. However, it may be advantageous to run the multiplication register faster to reduce the build up of dark signal. If a transfer gate is employed the multiplication register could be run at, say 10 MHz, and the transfer gate pulsed every 1 µs. In this case every 10th multiplication element will contain signal charge.

Figure 11:
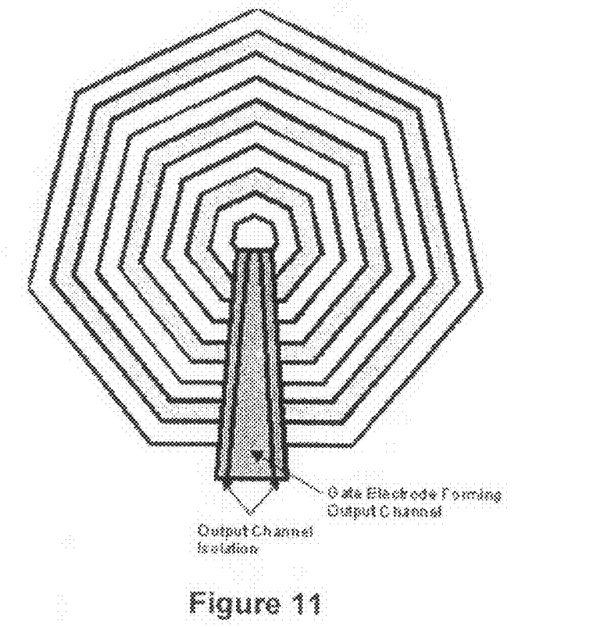
FIG. 11: shows an alternative embodiment in the form of a seven sided concentric sensor.
Figure 12:
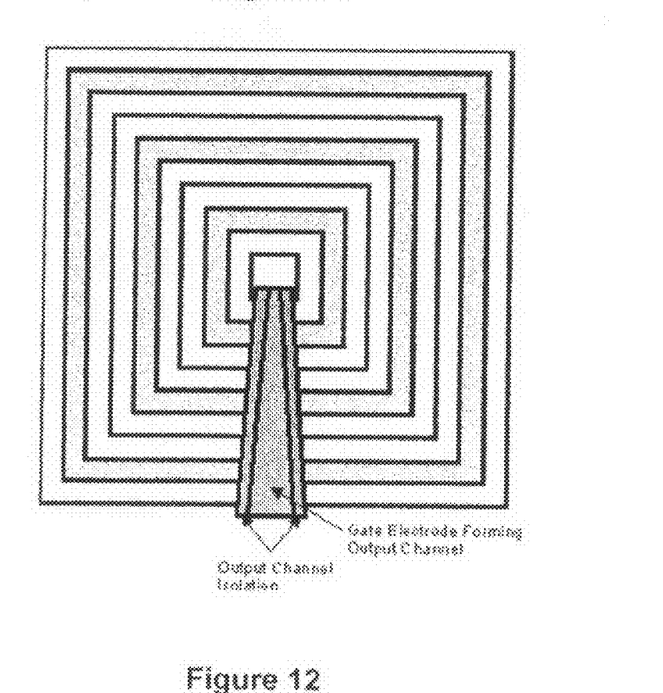
FIG. 12: shows an alternative embodiment in the form of a four sided concentric sensor.
Figure 13:
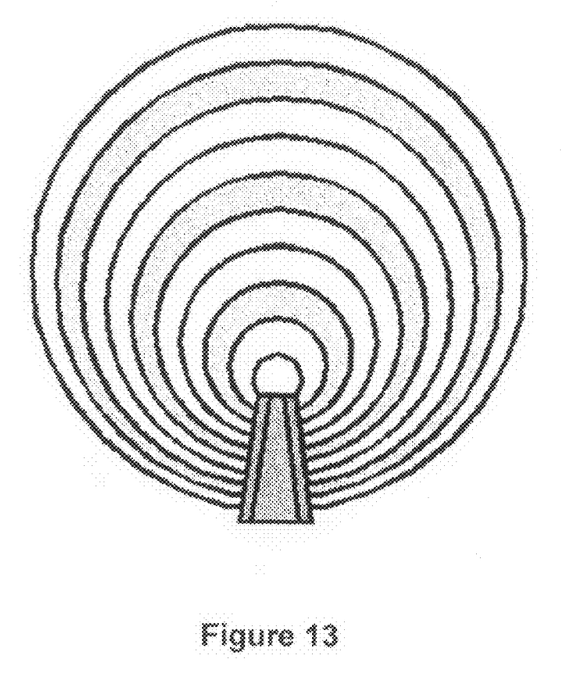
FIG. 13: shows an alternative embodiment in the form of a non-concentric sensor.
Figure 14:
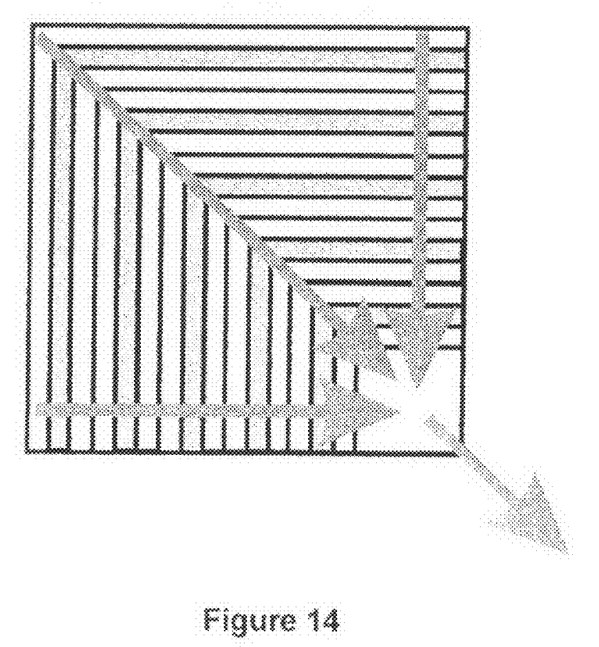
FIG. 14: shows an alternative embodiment in the form of a non-concentric sensor with an output to one side.

Some examples of alternative image section arrangements are shown in FIGS. 11 to 14. Note that these show the tapered output channel. Other arrangements could exist, including the use of a CCD clocking scheme, to extract the signal from the centre of the image area. The advantage of defining concentric gates as shown in FIGS. 11 and 12 is the detector area can be altered without moving the detector for ideal alignment with an optical axis. However, this may not be a significant issue and other, non-concentric arrangements are possible as illustrated in FIGS. 13 and 14.

In many applications, including confocal microscopy, single photons need to be detected. This requires the use of an electron multiplication register as known in the art and shown in FIG. 15. A variety of different shapes and arrangements of electrodes are possible. One such example is shown in FIG. 16 and is a segmented arrangement with the signal from each segment extracted into a different output circuit. For example, the detector could be divided into quadrants and so would have four output circuits. The signal from each quadrant could then be monitored to assist with the alignment of the optical system.

The control of the voltages applied to the electrodes may be by any suitable control biasing circuit. The control biasing circuit may take a variety of forms. One simple example is that the control lines from each of the electrodes are provided to a bank of switches so that the appropriate voltages may be set by an operator when using the device. Preferably, though, the control lines from the electrodes are connected to a control biasing circuit that is switchable by software control. This allows either operator controlled or automatic image area choice based on the signal received from the device or from other inputs.

It is convenient that the preferred structure of the new sensor device is of the buried channel conductor-insulator-semiconductor type as the charge multiplication register is also of this type and so these can be conveniently formed on a single silicon substrate.

The invention claimed is:

1. A sensor device of the type for sensing incident radiation by charge generation, comprising a substrate within which charge may be generated by incident radiation, a plurality of electrodes arranged to define an image area of the substrate and arranged with each successive electrode substantially surrounding the preceding electrode, wherein the electrodes are connectable to applied DC voltages such that an electric field is created across the image area to sweep charge without clocking across multiple electrodes from the image area to an output, at least one of the electrodes being connectable to a DC voltage of a level so as to present a barrier to charge within the image area, whereby the sensor has a variable sample area.

2. A sensor device according to claim 1, wherein the electrodes are concentric.

3. A sensor device according to claim 2, wherein the electrodes are each annular rings, each successive electrode substantially surrounding the preceding electrode, and surrounding a central substantially circular electrode.

4. A sensor device according to claim 3, wherein the electrodes are of substantially equal width.

5. A sensor device according to claim 1, wherein the electrodes are connectable to voltages such that charge is swept from a selectable number of the electrodes that are outer electrodes to one of the electrodes that is an inner electrode.

6. A sensor device according to claim 1, wherein the electrodes are connectable to voltages such that charge is swept from a selectable number of electrodes to an electrode at a perimeter of the sample area.

7. A sensor device according to claim 1, wherein the electrodes are arranged such that the sample area is divided into a plurality of segments, each segment having an output.

8. A sensor device according to claim 1, wherein the electrodes are connectable to DC voltages such that, one of the electrodes has a voltage level that provides a barrier to define the sample area and those electrodes within the sample area have voltage levels to sweep charge to an output.

9. A sensor device according to claim 8 wherein the electrodes are connectable to DC voltages such that electrodes outside the sample area have voltage levels to sweep charge away from the barrier.

10. A sensor device according to claim 8, wherein the electrodes are connectable to DC voltages such that electrodes outside the sample area have voltage levels to sweep charge away towards a drain.

11. A sensor according to claim 8, wherein the electrodes that are outside the sample area have high voltage levels so as to fully deplete the substrate outside the sample area of mobile charge.

12. A sensor device according to claim 1, wherein the output comprises an output channel coupled to the sample area, the output channel having an electrode connectable to a DC voltage and having a channel potential that increases along the channel, the charge from the sample area being swept along the output channel away from the sample area.

13. A sensor device according to claim 12, wherein the output channel has a tapering width, a narrow end and a wide end and is coupled at the narrow end to the region of the electrode toward which charge is swept from the sample area, and wherein the tapering width is such that the channel potential increases along the channel.

14. A sensor device according to claim 12, wherein the output channel is coupled to the region of an electrode within the sample area.

15. A sensor device according to claim 14, wherein the electrode toward which charge is swept is at the centre of the sample area, and wherein the output channel sweeps charge from the centre of the sample area to outside the sample area.

16. A sensor device according to claim 1, further comprising a charge multiplication register coupled to the sample area and arranged to multiply charge from the sample area.

17. A sensor device according to claim 16, wherein the plurality of electrodes and multiplication register are fabricated together as a buried channel structure.

18. A laser scanning microscopy device comprising a sensor device of claim 1.

19. A method of operating a sensor device of the type for sensing incident radiation by charge generation, comprising a substrate within which charge may be generated by incident radiation, and a plurality of electrodes arranged to define an image area of the substrate and arranged with each successive electrode substantially surrounding the preceding electrode comprising:
connecting the electrodes to DC voltages such that an electric field is created across the image area to sweep charge without clocking across multiple electrodes from the image area to an output, and
connecting at least one of the electrodes to a DC voltage of a level so as to present a barrier to charge within the image area, whereby the sensor has a variable sample area.

20. A method according to claim 19, comprising connecting the electrodes to voltages such that charge is swept from a selectable number of the electrodes that are outer electrodes to one of the electrodes that is an inner electrode.

21. A method according to claim 19, comprising connecting the electrodes to voltages such that charge is swept from a selectable number of electrodes to an electrode at a perimeter of the sample area.

22. A method according to claim 19, comprising connecting the electrodes to DC voltages such that one of the electrodes has a voltage level that provides a barrier to define the sample area and those electrodes within the sample area have voltage levels to sweep charge to an output.

23. A method according to claim 22, comprising connecting the electrodes to DC voltages such that electrodes outside the sample area have voltage levels to sweep charge away from the barrier.

24. A method according to claim 22, comprising connecting the electrodes to DC voltages such that electrodes outside the sample area have voltage levels to sweep charge away towards a drain.

25. A method according to claim 22, comprising connecting the electrodes to DC voltages such that the electrodes that are outside the sample area have high voltage levels so as to fully deplete the substrate outside the sample area of mobile charge.

* * * * *